United States Patent [19]

Ohya

[11] Patent Number: 5,745,064
[45] Date of Patent: Apr. 28, 1998

[54] D/A CONVERSION DEVICE HAVING MULTIPLE D/A CONVERTERS WITH SUBSTANTIALLY EQUAL VOLTAGES SUPPLIED THERETO

[75] Inventor: Yuri Ohya, Nishinomiya, Japan

[73] Assignee: Matsushita Electric Industrial Co., Ltd., Kadoma, Japan

[21] Appl. No.: 545,400

[22] Filed: Oct. 19, 1995

[30] Foreign Application Priority Data

Oct. 25, 1994 [JP] Japan ................................. 6-260169

[51] Int. Cl.$^6$ ................................................ H03M 1/66
[52] U.S. Cl. ................................................ 341/144
[58] Field of Search ................................. 341/144, 146, 341/136, 126

[56] References Cited

U.S. PATENT DOCUMENTS

| | | | |
|---|---|---|---|
| 4,393,370 | 7/1983 | Hareyama | 340/347 |
| 5,091,728 | 2/1992 | Chang | 341/153 |
| 5,164,725 | 11/1992 | Long | 341/118 |
| 5,293,166 | 3/1994 | Ta | 341/118 |
| 5,327,134 | 7/1994 | Nakamura et al. | 341/144 |
| 5,331,322 | 7/1994 | Cha et al. | 341/136 |
| 5,343,196 | 8/1994 | Harston | 341/136 |
| 5,452,014 | 9/1995 | Manley | 348/57 |

FOREIGN PATENT DOCUMENTS

| | | | |
|---|---|---|---|
| 0277027 | 11/1989 | Japan | 341/144 |
| 0288420 | 11/1990 | Japan | 341/144 |
| 334627 | 2/1991 | Japan | . |
| 405191289 | 7/1993 | Japan | 341/144 |
| 405191290 | 7/1993 | Japan | 341/144 |

OTHER PUBLICATIONS

Oka et al, Report of the Institute of Electronics, Inf. and Comm. Engrs., ICD88–6, pp. 39–46, "A 30–MHz 10–Bit CMOS D/A Converter." Jun. 1988.

*Primary Examiner*—Brian K. Young
*Attorney, Agent, or Firm*—Renner, Otto, Boisselle & Sklar, P.L.L.

[57] ABSTRACT

A D/A conversion device of the present invention includes: a first converter for converting a digital signal into an analog signal; a second converter for converting a digital signal into an analog signal; a power supplying circuit for supplying a voltage to the first converter and the second converter; and a power supply main line for connecting the first converter and the second converter to the power supplying circuit, wherein a voltage rise or a voltage drop caused by resistance of the power supply main line from the power supplying circuit to the first converter is substantially equal to a voltage rise or a voltage drop caused by resistance of the power supply main line from the power supplying circuit to the second converter.

9 Claims, 12 Drawing Sheets

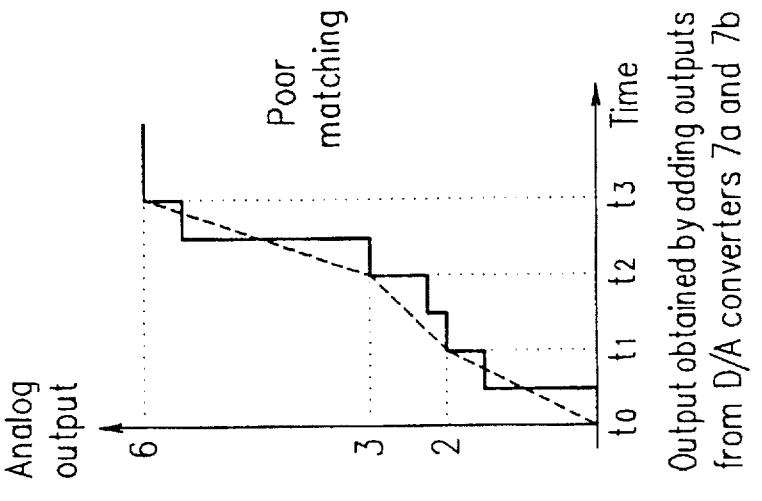
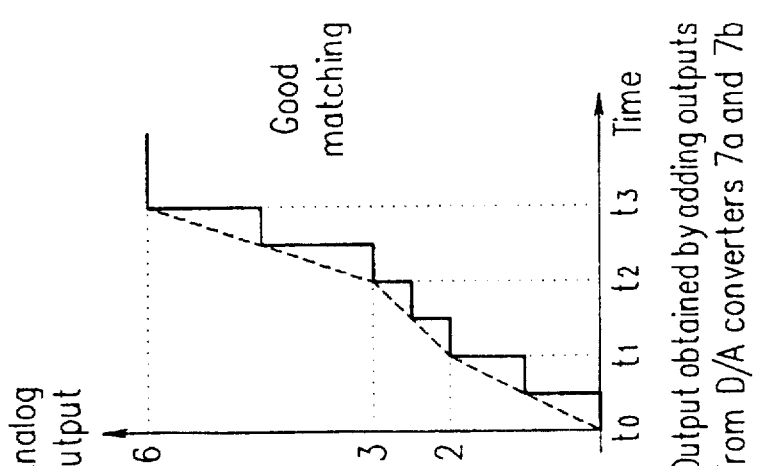
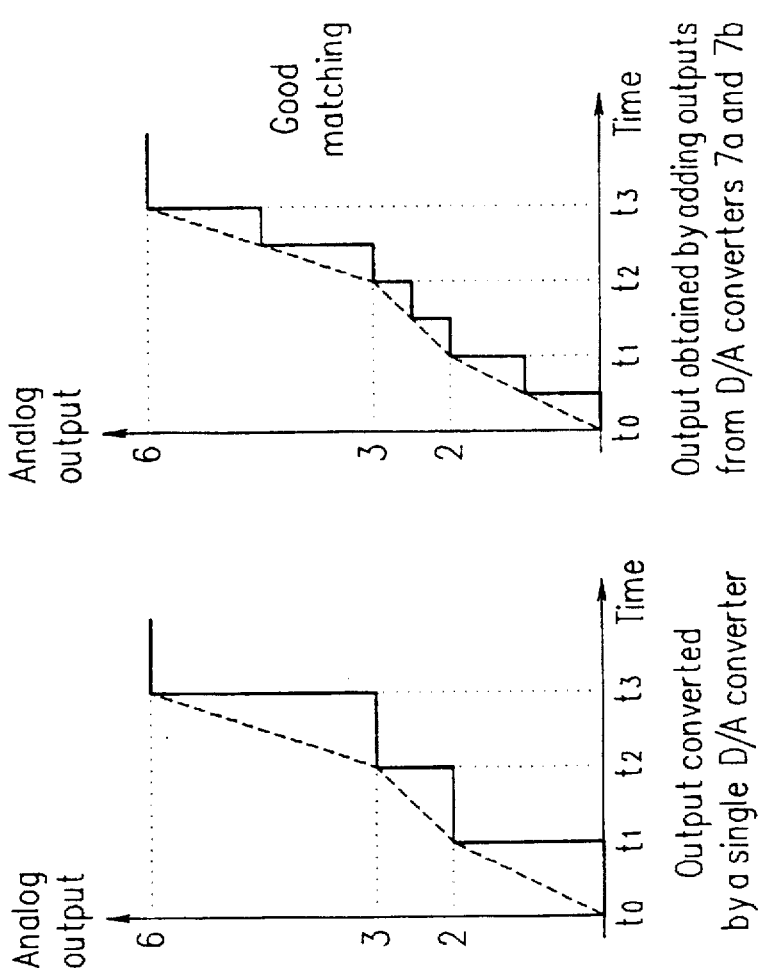

D/A CONVERSION DEVICE HAVING MULTIPLE D/A CONVERTERS WITH SUBSTANTIALLY EQUAL VOLTAGES SUPPLIED THERETO

BACKGROUND OF THE INVENTION

1. Field of the Invention

The present invention relates to a D/A conversion device including a plurality of D/A converters. In particular, the present invention relates to a D/A conversion device suitable for adding an output of a D/A converter and an output of another D/A converter and for outputting a resultant output.

2. Description of the Related Art

Recently, D/A (digital-analog) conversion circuit techniques have been recognized to provide higher resolution and higher accuracy. As video and audio techniques are being more and more digitalized, the required specifications thereof vary. In particular, in the encoding of video signals and the like, it is required to perform several kinds of D/A conversions related to each other with high accuracy using a number of D/A converters. These D/A conversions often employ a current cell matrix type D/A converter because of its good accuracy. The current cell matrix type D/A converter has a plurality of conversion elements called current cells which are arranged in a matrix form. The current cell matrix type D/A converter renders current cells active, the number of which corresponds to the digital value. Then, the current cell matrix type D/A converter adds current outputs from the current cells, thereby performing D/A conversion. Regarding the operation of the current cell matrix type D/A converter, see "30 MHz 10 bit CMOS D/A converter", The Institute of Electronics, Information and Communication Engineers, ICD-88-6, pp.39–46.

If D/A conversion is performed using the current cell matrix type D/A converter, variation in the amount of output current among the current cells leads to errors. Such an error results for the following reasons: (1) variations in the process for fabricating the current cells; (2) differences in the power potential between the current cells due to resistance of a power supply wiring; (3) changes in the amount of current due to variations of voltage at an output terminal of the current cell.

In order to reduce errors due to variations in the fabrication process, the current cell is arranged so as to be as close as possible to another current cell, or the positional partiality of the current cells which are rendered active by a decoder is excluded. In order to reduce errors produced by differences in the power potential, a method for lowering the resistance of the power supply wiring or a method for excluding the positional partiality of the current cells rendered active by the decoder is used. As the method for lowering the resistance of the power supply wiring, a method using a wiring layer dedicated to the power supply source, a method for widening the power supply wiring, and a method for providing the current source between the current cells in a mesh form and the like are known. Conventionally, in order to reduce errors due to variations of voltage at an output terminal, the variation in the current corresponding to the variation in the voltage at the output terminal is reduced by increasing the transistor length.

If current outputs from a plurality of current cell matrix type D/A converters are added, errors among the D/A converters should be minimized, in addition to the minimization of errors in each D/A convertor. The reason for this is as follows. In the case where variations in the output current among the D/A converters is large, the added analog outputs with high accuracy is not obtained even if errors are minimized in each D/A converter.

Similarly with respect to errors among the current cells in a single D/A converter, errors among D/A converters are produced by variation in the process and the resistance of a power supply wiring.

However, if the width of a power supply main line for connecting D/A converters becomes large in order to reduce errors among the D/A converters, an area required to layout each D/A converter increases. As a result, the required area of a chip increases, which in turn induces an increase in cost. It is required that the width of a power supply main line is larger than that of a power supply branch line. Therefore, an increase in the width of the power supply main line greatly affects an increase in the layout area. Moreover, the use of a wiring layer dedicated to the power supply source increases the number of layers to be used, which in turn increases the cost.

SUMMARY OF THE INVENTION

The D/A conversion device of this invention includes: first conversion means for converting a digital signal into an analog signal; second conversion means for converting a digital signal into an analog signal; power supplying means for supplying a voltage to the first conversion means and the second conversion means; and a power supply main line for connecting the first conversion means and the second conversion means to the power supplying means, wherein a voltage rise or a voltage drop caused by resistance of the power supply main line from the power supplying means to the first conversion means is substantially equal to a voltage rise or a voltage drop caused by resistance of the power supply main line from the power supplying means to the second conversion means.

In one embodiment of the present invention, the resistance of the power supply main line from the power supplying means to the first conversion means is substantially equal to the resistance of the power supply main line from the power supplying means to the second conversion means.

In another embodiment of the present invention, each of the first conversion means and the second conversion means includes: a plurality of converters, each converting a unit digital value to a unit analog value; a power supply branch line for connecting each of the plurality of conversion elements to the power supply main line; and decode means for selectively rendering zero or more of the plurality of conversion elements active in accordance with the digital signal, and a voltage rise or a voltage drop caused by resistance of the power supply branch line in the first conversion means is substantially equal to a voltage rise or a voltage drop caused by resistance of the power supply branch line in the second conversion means.

According to another aspect of the invention, a D/A conversion device includes: first conversion means for converting a digital signal into an analog signal; second conversion means for converting a digital signal into an analog signal; and at least one power supplying means for supplying a voltage to the first conversion means and the second conversion means, wherein each of the first conversion means and the second conversion means includes: a plurality of converters, each converting a unit digital value into a unit analog value; and a decoder for selectively rendering zero or more of the plurality of conversion elements active in accordance with the digital signal, the plurality of conversion elements and the decoder included in the first conversion means are arranged symmetrical to the plurality of conversion elements and the decoder included in the second conversion means with respect to an axis, and each of the at least one power supplying means is arranged so as to be substantially the same distance from the axis.

In one embodiment of the invention, a D/A conversion device further includes output means for adding an output from the first conversion means in an earlier half of a predetermined time period and an output from the second conversion means in a later half of the predetermined time period and for outputting an added output.

In another embodiment of the invention, one of the at least one power supplying means is arranged on the axis.

In still another embodiment of the invention, each of the plurality of conversion elements includes: a constant current source for generating a constant current based on a voltage supplied from one of the at least one power supplying means; and switching means connected to the constant current source, for switching ON/OFF in response to a control signal.

In still another embodiment of the invention, the constant current source is a transistor.

In still another embodiment of the invention, the plurality of conversion elements are arranged in a matrix form, and the decoder selectively renders zero or more of the plurality of conversion elements active so as to eliminate positional concentration of the conversion element rendered active in accordance with the digital signal.

According to a D/A converter of the present invention, a voltage rise or drop caused by wiring resistance of a power supply main line from the power supplying means to the first conversion means is substantially equal to a voltage rise or drop caused by wiring resistance of the power supply main line from the power supplying means to the second conversion means. By this setting, errors of the voltage caused by resistance of the power supply main line can be eliminated. As a result, substantially same voltage is supplied to the first conversion means and the second conversion means from the power supplying means.

Moreover, in the case where each of the first and second conversion means includes a plurality of conversion elements, a voltage rise or a voltage drop caused by resistance of each of the plurality of power supply branch lines from the power supply main line to each of the plurality of conversion elements is substantially the same. By this setting, errors of the voltage caused by resistance of the power supply main line can be eliminated. As a result, substantially same voltage is supplied to each of the conversion elements in the first conversion means and each of the conversion elements in the second conversion means from the power supplying means.

In this way, errors between the analog value output from the first means and the analog value output from the second means with respect to the same digital value are reduced.

According to another D/A conversion device of the present invention, a plurality of conversion elements and a decoder included in the first conversion means are placed symmetrical to a plurality of conversion elements and a decoder included in the second conversion means with respect to a certain axis. At least one power supplying means is placed so as to be apart from the axis by the substantially same distance. By providing such a layout, errors of the voltage occur due to resistance of the power supply main line and resistance of a power supply branch line can be eliminated. As a result, in the case where the same digital value is input to the first conversion means and the second conversion means, a voltage supplied to conversion elements rendered active in the first conversion means becomes substantially identical with that supplied to conversion elements rendered active in the second conversion means. Furthermore, by providing such a layout, an integral error curve of the first conversion means becomes completely identical with that of the second conversion means. As a result, in the case where the addition of an output from the first conversion means in the earlier half of a predetermined time period and an output from the second conversion means in the later half of a predetermined time period is output, a smooth output can be obtained.

Thus, the invention described herein makes possible the advantages of: (1) providing a D/A conversion device, in which variations in the amount of output current is small among a plurality of D/A converters; (2) providing a D/A conversion device for adding an output from a D/A conversion device and an output from another D/A conversion device; and (3) providing a D/A conversion device capable of occupying a chip of area having a conventional value, in which a power supply wiring and another power supply wiring can share a wiring layer.

These and other advantages of the present invention will become apparent to those skilled in the art upon reading and understanding the following detailed description with reference to the accompanying figures.

BRIEF DESCRIPTION OF THE DRAWINGS

FIG. 2A is a graph showing an analog output from a single D/A converter; FIG. 2B is a graph showing an analog output obtained by adding outputs from two D/A converters in the case where matching between output curves is good; and FIG. 2C is a graph showing an analog output obtained by adding outputs from two D/A converters in the case where matching between output curves is poor.

DESCRIPTION OF THE PREFERRED EMBODIMENTS

Hereinafter, examples of the present invention will be described by way of illustrative drawings.

First, the principle of the present invention will be described.

Figure 1:
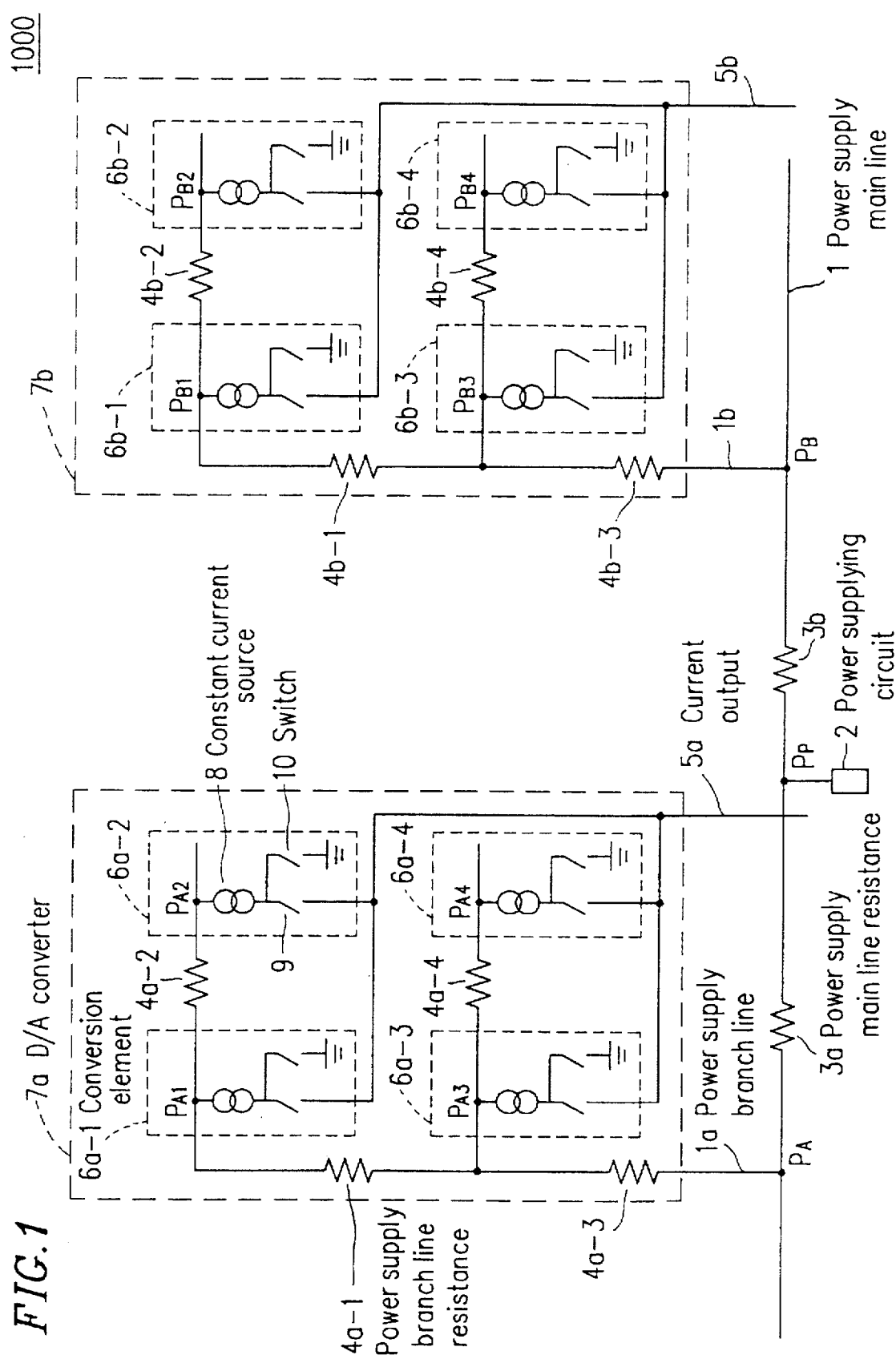
FIG. 1 is a diagram showing the configuration of a D/A conversion device according to the present invention.

FIG. 1 shows the configuration of a D/A conversion device 1000 according to the present invention. The D/A conversion device 1000 includes a D/A converter 7a and a D/A converter 7b. The D/A conversion device 1000 further includes a power supplying circuit 2 for supplying a voltage to the D/A converters 7a and 7b.

The D/A conversion device 1000 includes a power supply main line 1 and power supply branch lines 1a and 1b. The D/A converter 7a is connected to the power supply main line 1 at a point $P_A$. The D/A converter 7b is connected to the power supply main line 1 at a point $P_B$. A voltage from the power supplying circuit 2 is supplied to the D/A converter 7a and the D/A converter 7b through the power supply main line 1.

The D/A converter 7a includes conversion elements 6a-1 to 6a-4 for converting a unit digital value to a unit analog value. The conversion elements 6a-1 through 6a-4 can be arranged in a matrix form. The D/A converter 7b includes conversion elements 6b-1 to 6b-4 for converting a unit digital value to a unit analog value. The conversion elements 6b-1 through 6b-4 can be arranged in a matrix form. In an example shown in FIG. 1, the number of conversion elements included in each of the D/A converters 7a and 7b is 4. However, the number of conversion elements included in each of the D/A converters 7a and 7b is not limited to 4. The D/A converters 7a and 7b can each include a conversion element of an arbitrary number of 1 or more.

Each of the conversion elements 6a-1 through 6a-4 is connected to the power supply main line 1 via the power supply branch line 1a. The conversion elements 6a-1 through 6a-4 are connected to the power supply branch line 1a at points $P_{A1}$ through $P_{A4}$, respectively. The power supply branch line 1a is connected to the power supply main line 1 at the point $P_A$.

Each of the conversion elements 6a-1 through 6a-4 has a constant current source 8 and switches 9 and 10 connected to the constant current source 8. The constant current source 8 generates a constant current based on a voltage supplied from the power supplying circuit 2. The switches 9 and 10 are controlled so as to be exclusively switched ON/OFF by a decoder section (not shown). When the switch 9 is turned ON by the decoder section, a constant current from the constant current source 8 flows into a current output 5a. Alternatively, a constant current from the constant current source 8 flows into the power supplying circuit 2 via the power supply branch line 1a and the power supply main line 1. When the switch 10 is turned ON by the decoder portion, the constant current source 8 is grounded.

Each of the conversion elements 6b-1 through 6b-4 is connected to the power supply main line 1 via the power supply branch line 1b.

The power supply main line 1 has wiring resistance. The wiring resistance of the power supply main line 1 between the points $P_A$ and $P_P$ is represented by constriction resistance 3a. The wiring resistance of the power supply main line 1 between the points $P_A$ and $P_B$ is represented by constriction resistance 3b.

The power supply branch line 1a has wiring resistance. The wiring resistance of the power supply branch line 1a between the points $P_{A3}$ and $P_{A1}$ is represented by constriction resistance 4a-1. The wiring resistance of the power supply branch line 1a between the points $P_{A1}$ and $P_{A2}$ is represented by constriction resistance 4a-2. The wiring resistance of the power supply branch line 1a between the points $P_A$ and $P_{A3}$ is represented by constriction resistance 4a-3. The wiring resistance of the power supply branch line 1a between the points $P_{A3}$ and $P_{A4}$ is represented by constriction resistance 4a-4.

The power supply branch line 1b has wiring resistance. The wiring resistance of the power supply branch line 1b between the points $P_{B3}$ and $P_{B1}$ is represented by constriction resistance 4b-1. The wiring resistance of the power supply branch line 1b between the points $P_{B1}$ and $P_{B2}$ is represented by constriction resistance 4b-2. The wiring resistance of the power supply branch line 1b between the points $P_B$ and $P_{B3}$ is represented by constriction resistance 4b-3. The wiring resistance of the power supply branch line 1b between the points $P_{B3}$ and $P_{B4}$ is represented by constriction resistance 4b-4.

In the D/A conversion device 1000, the D/A converters 7a and 7b are arranged so that a voltage rise or drop caused by the wiring resistance of the power supply main line 1 from the power supplying circuit 2 to the D/A converter 7a is substantially equal to a voltage rise or drop caused by the wiring resistance of the power supply main line 1 from the power supplying circuit 2 to the D/A converter 7b. For example, the D/A converters 7a and 7b are arranged so that the constriction resistance 3a and the constriction resistance 3b of the power supply main line 1 are substantially equal to each other. By this arrangement, a voltage rise or drop caused by the wiring resistance of the power supply main line 1 from the power supplying circuit 2 to the D/A converter 7a is made substantially equal to a voltage rise or drop caused by the wiring resistance of the power supply main line 1 from the power supplying circuit 2 to the D/A converter 7b. This is because a constant current flows through the power supply main line 1 and the power supply branch lines 1a and 1b.

Moreover, in the D/A conversion device 1000, the conversion elements 6a-1 through 6a-4 and the conversion elements 6b-1 through 6b-4 are arranged so that wiring resistance of the corresponding power supply branch lines is the same. Specifically, the conversion elements 6a-1 through 6a-4 and the conversion elements 6b-1 through 6b-4 are arranged so that the following relationships are satisfied.

Constriction resistance 4a-1=Constriction resistance 4b-1,
Constriction resistance 4a-2=Constriction resistance 4b-2,
Constriction resistance 4a-3=Constriction resistance 4b-3, and
Constriction resistance 4a-4=Constriction resistance 4b-4

In this case, it is assumed that, with respect to the same digital value, a column and a row of the conversion elements rendered active by the decoder section in the D/A converter 7a are identical with those of conversion elements rendered active by the decoder section in the D/A converter 7b. For example, in the case where the conversion element 6a-1 is rendered active in the D/A converter 7a with respect to the digital value of "1", the conversion element 6b-1 is rendered active in the D/A converter 7b. In the case where the conversion elements 6a-1 and 6a-4 are rendered active in the D/A converter 7a with respect to the digital value of "2", the conversion elements 6b-1 and 6b-4 are rendered active in the D/A converter 7b.

The relationship described above is achieved by the following arrangement. The conversion elements 6a-1 through 6a-4 and the conversion elements 6b-1 through 6b-4 are arranged so that the distances from the power supplying circuit 2 to the respective conversion elements 6a-1 through 6a-4 are equal to those from the power supplying circuit 2 to the respective conversion elements 6b-1 through 6b-4. Then, these conversion elements are connected to each other using the power supply main line 1 and the power supply branch lines 1a and 1b having wiring resistance proportional to their lengths.

When the above-mentioned relationships are satisfied in this way, a power potential of the conversion element rendered active in the D/A converter 7a becomes identical with that of the conversion element rendered active in the D/A converter 7b. As a result, the amount of a full-scale current of the D/A converter 7a becomes identical with that of the D/A converter 7b. This is because the amount of a full-scale current denotes the amount of current output from the D/A converter when all conversion elements included in the D/A converter are rendered active.

In the case where an output from the D/A converter 7a and an output from the D/A converter 7b are added while delaying one output from another output by a ½ cycle of a clock signal, the amount of full-scale current of the D/A converter 7a and that of D/A converter 7b are required to be identical with each other. The reason for this is because an average analog value of the D/A converter 7a differs from that of the D/A converter 7b in the case where the full-scale current amount of the D/A converter 7a and that of the D/A converter 7b are not identical with each other, even if each of the D/A converters 7a and 7b have extremely good conversion accuracy. The difference in the average analog value causes a differential error or an integral error.

On the other hand, in the case where the full-scale current amount of the D/A converter 7a and that of the D/A converter 7b are identical with each other, an average analog value of the D/A converter 7a and that of the average analog value of the D/A converter 7b are identical with each other. In such a case, variations in the analog value among the D/A converters 7a and 7b can be kept within the range of a differential error in each of D/A converters 7a and 7b.

The power potential of the conversion elements rendered active in the D/A converter 7a is identical with that of the conversion elements rendered active in the D/A converter 7b, whereby an output curve of the D/A converter 7a becomes identical with that of the D/A converter 7b. In the present specification, an identity between output curves of two D/A converters is also referred to as "good matching between output curves of two D/A converters". Herein, the output curve denotes a curve showing the relationship between the digital value to be input and the analog value to be output. This will be described below in detail with reference to FIGS. 7A to 7E.

In the case where an output from the D/A converter 7a and an output from the D/A converter 7b are added while delaying one output from another output by a ½ cycle of a clock signal, the output curves of the D/A converters 7a and 7b are required to be identical with each other. The reason for this is described below.

In order to perform one D/A conversion at double speed, the D/A converter 7a and the D/A converter 7b, in which the amount of full-scale current is halved, are prepared. The D/A converter 7a operates in response to the rising edge of a clock signal, and the D/A converter 7b operates in response to the falling edge of the clock signal. An output from the D/A converter 7a and an output from the D/A converter 7b are subjected to analog addition. In this way, an added output is obtained.

For the purpose of obtaining a smoother output than that of a single D/A converter, an output from the D/A converter 7a and an output from the D/A converter 7b are added while delaying one output from another output by a ½ cycle of a clock signal. In the case where the output curve of the D/A converter 7a and the output curve of the D/A converter 7b are identical with each other, the analog value which is subjected to D/A conversion by the D/A converter 7a in the earlier ½ cycle of a clock signal is identical with the analog value which is subjected to D/A conversion by the D/A converter 7b in the later ½ cycle of the clock signal. Therefore, the added output is equal to the analog value converted by a single D/A converter. Thus, a differential error and an integral error in the D/A converters 7a and 7b are retained without being amplified in the added output.

In each of the D/A converters 7a and 7b, if a differential error is retained within ½ LSB (Least Significant Bit), a digital value is not erroneously converted to an incorrect analog value. In order to obtain a smoother output than an output of a single D/A converter, however, it is necessary to reduce the difference in the analog value between the D/A converters 7a and 7b with respect to the same digital value to about ¹⁄₁₀ LSB. If not, distortion of the signal occurs. It is possible to obtain a smooth output without making the output curves of two D/A converters identical with each other if a differential error itself in each of the D/A converters 7a and 7b can be reduced to ¹⁄₁₀ LSB. In view of the existing techniques, however, it is extremely difficult in terms of accuracy to achieve reducing the differential error to ¹⁄₁₀ LSB in each of the D/A converters 7a and 7b.

In FIG. 2A, a solid line represents the analog value output from a single D/A converter with respect to the digital values "0", "2", "3" and "6" input to the D/A converter at respective times $t_0$ to $t_3$.

FIG. 2B shows an analog output obtained by adding the outputs from the two D/A converters 7a and 7b in the case where matching of the output curves of the D/A converters 7a and 7b is good. In this case, a waveform of the added analog output shown in FIG. 2B is obtained by refining the analog output shown in FIG. 2A.

FIG. 2C is an analog output obtained by adding the outputs from the two D/A converters 7a and 7b in the case where matching of the output curves of the D/A converters 7a and 7b is poor. In this case, a waveform of the added analog output shown in FIG. 2C differs from that of the analog output shown in FIG. 2A. This signifies that distortion is generated in the added analog output.

Figure 3:
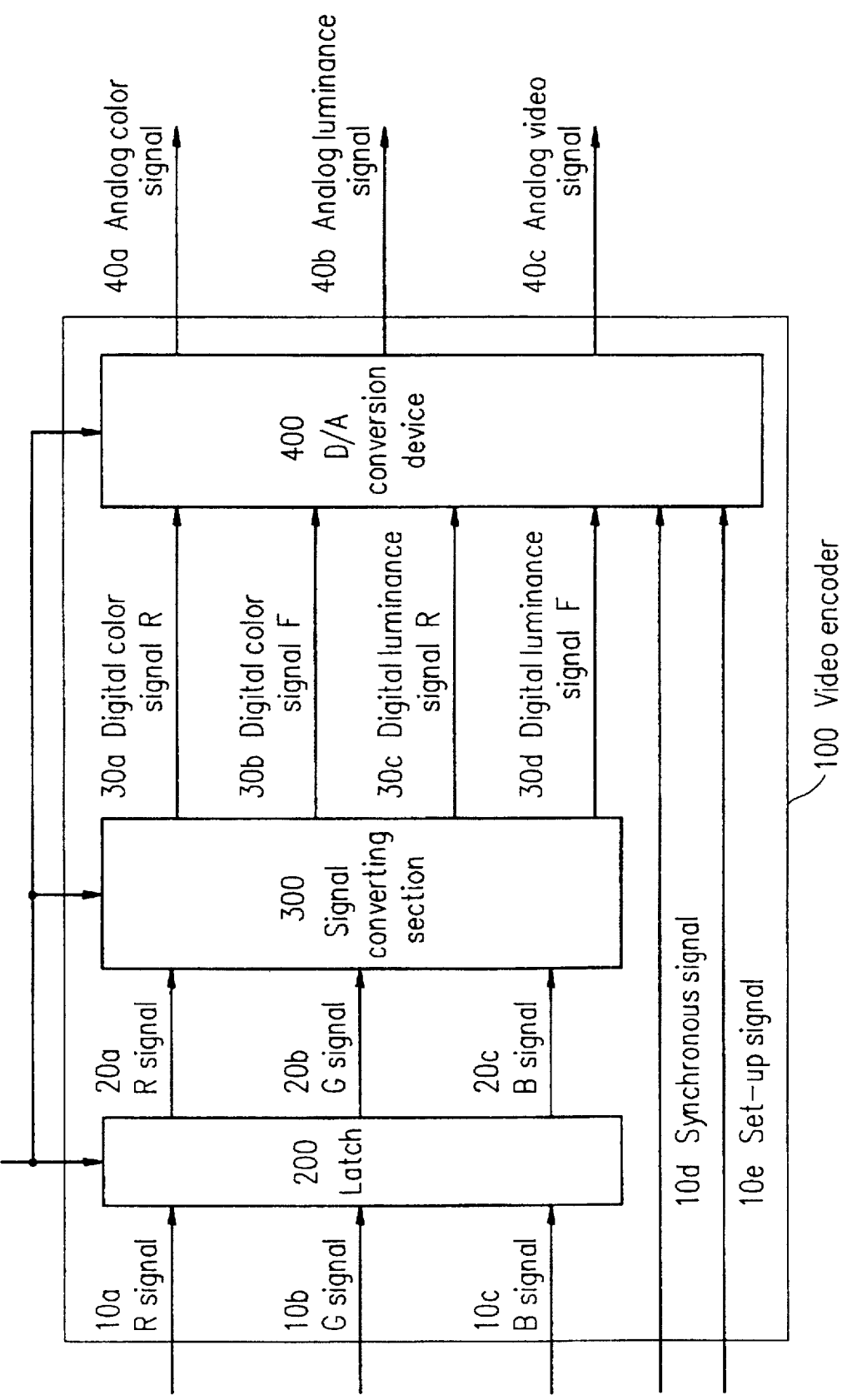
FIG. 3 is a diagram showing the configuration of a video encoder including an example of a D/A conversion device according to the present invention.

FIG. 3 shows the configuration of a video encoder 100 including an example of a D/A conversion device according to the present invention. The video encoder 100 includes: a latch 200 for temporary holding an R signal 10a, a G signal 10b and a B signal 10c which are input; a signal converting section 300 for converting an R signal 20a, a G signal 20b and a B signal 20c which are output from the latch 200 to digital color signals 30a and 30b and digital luminance signals 30c and 30d; a D/A conversion device 400 for converting the digital color signals 30a and 30b and the digital luminance signal 30c and 30d to an analog color signal 40a, an analog luminance signal 40b and an analog video signal 40c.

Hereinafter, the operation of the video encoder 100 will be described. The R signal 10a, the G signal 10b and the B signal 10c in a digital form are input to the video encoder 100. The R signal 10a, the G signal 10b and the B signal 10c which are input are temporary held by the latch 200. Then, the R signal 10a, the G signal 10b and the B signal 10c are output to the signal converting section 300 as the R signal 20a, the G signal 20b and the B signal 20c in synchronous with a clock signal 50. The signal converting section 300 converts the R signal 20a, the G signal 20b and the B signal 20c by a digital processing in accordance with a standard of a video signal. The signal converting section 300 outputs the digital color signal R (30a) and the digital luminance signal R (30c) in synchronous with the rising edge of the clock signal 50, and outputs the digital color signal F (30b) and the digital luminance signal F (30d) in synchronous with the falling edge of the clock signal 50. The D/A conversion device 400 converts digital signals to analog signals, and adds the resultant analog signals. The D/A conversion device 400 outputs the analog color signal 40a and the analog luminance signal 40b for S-VHS and the analog video signal 40c for usual TV broadcasting.

Figure 4:
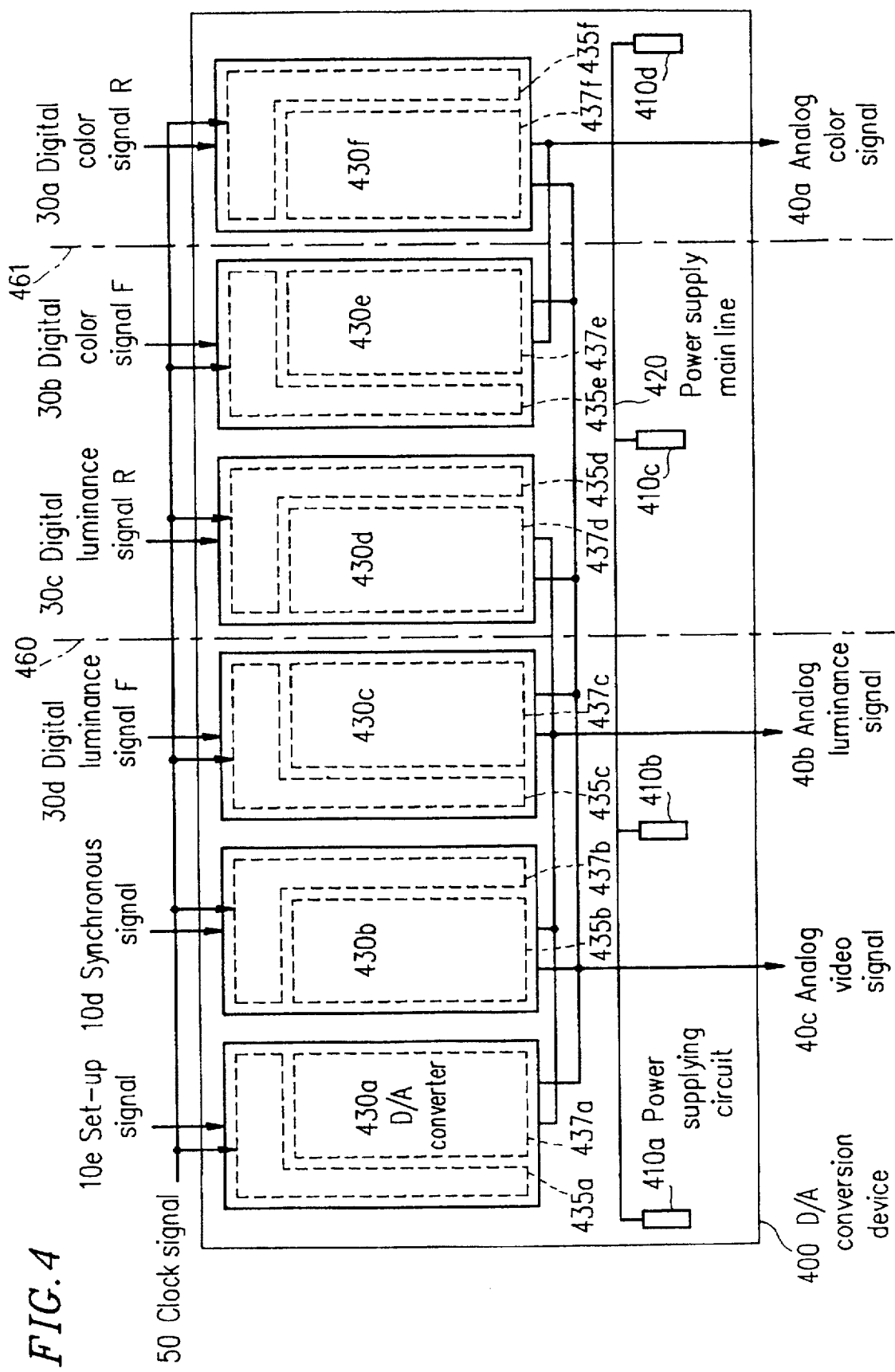
FIG. 4 is a diagram showing the configuration of an example of a D/A conversion device according to the present invention.

FIG. 4 shows the configuration of the D/A conversion device 400. The D/A conversion device 400 includes: D/A converters 430a through 430f; and power supplying circuits 410a through 410d for supplying voltages to the D/A converters 430a through 430f. In addition, the D/A conversion device 400 is provided with a power supply main line 420. Although not apparent in FIG. 4, a voltage from the power supplying circuits 410a through 410d are supplied to the D/A converters 430a through 430f via the power supply main line 420.

A synchronous signal 10d, a set-up signal 10e, the digital color signal R (30a), the digital color signal F (30b), the digital luminance signal R (30c) and the digital luminance signal F (30d) are input to the D/A conversion device 400 in synchronous with the clock signal 50. In response to these input signals, the D/A conversion device 400 outputs the analog color signal 40a, the analog luminance signal 40b and the analog video signal 40c.

The set-up signal 10e is for setting an analog output level in the analog luminance signal 40b. The synchronous signal 10d is for setting a pulse signal which is first input so as to synchronize the transfer of a sequence of luminance data and chromaticity data.

Hereinafter, the operation of the D/A conversion device 400 will be described. Each of the D/A converters 430a through 430f includes one digital input and two analog outputs. One of the two analog outputs is a current output, and the other is an inverted current output. The current output is used as a signal. The inverted current output is used after performing an inverse processing in the external portion of each D/A converter.

In the D/A conversion device 400, the inverted current outputs from the D/A converters 430a through 430f are subjected to analog addition, thereby generating an inverted video signal. The current outputs from the D/A converters 430a through 430d are subjected to analog addition, thereby generating the analog luminance signal 40b as an analog value corresponding to the set-up signal 10e, the synchronous signal 10d, the digital luminance signal F (30d) and the digital luminance signal R (30c). The current outputs from the D/A converters 430e through 430f are subjected to analog addition, thereby generating the analog color signal 40a as an analog value corresponding to the digital color signal F (30b) and the digital color signal R (30a).

The D/A converters 430c and 430d have a full-scale current value half that required for luminance signals. The D/A converter 430c converts the digital luminance signal F (30d) to an analog signal, and then outputs the resultant analog signal in response to the falling edge of the clock signal 50. The D/A converter 430d converts the digital luminance signal R (30c) to an analog signal, and then outputs the resultant analog signal in response to the rising edge of the clock signal 50. In this way, an analog signal corresponding to the digital luminance signal R (30c) is output from the D/A converter 430d in the earlier ½ cycle of one cycle of the clock signal 50, and an analog signal corresponding to the digital luminance signal F (30d) is output from the D/A converter 430c in the later ½ cycle of one cycle of the clock signal 50. Then, the analog signal output from the D/A converter 430c and the analog signal output from the D/A converter 430d are added. The analog signal by such addition is the same as an analog signal generated by using a double-speed clock signal of the clock signal 50 in a pseudo manner.

The D/A converters 430e and 430f have a full-scale current value half that required for color signals. The D/A converter 430e converts the digital color signal F (30b) into an analog signal, and then outputs the analog signal thus obtained in response to the falling edge of the clock signal 50. The D/A converter 430f converts the digital color signal R (30a) into an analog signal, and then outputs the analog signal thus obtained in response to the rising edge of the clock signal 50. In this way, an analog signal corresponding to the digital color signal R (30a) is output from the D/A converter 430f in the earlier ½ cycle of one cycle of the clock signal 50, and an analog signal corresponding to the digital color signal F (30b) from the D/A converter 430e in the later ½ cycle of one cycle of the clock signal 50. The analog signal output from the D/A converter 430e and the analog signal output from the D/A converter 430f are added. The analog signal obtained by such addition is the same as an analog signal generated by using a double-speed clock signal of the clock signal 50 in a pseudo manner.

Figure 5:
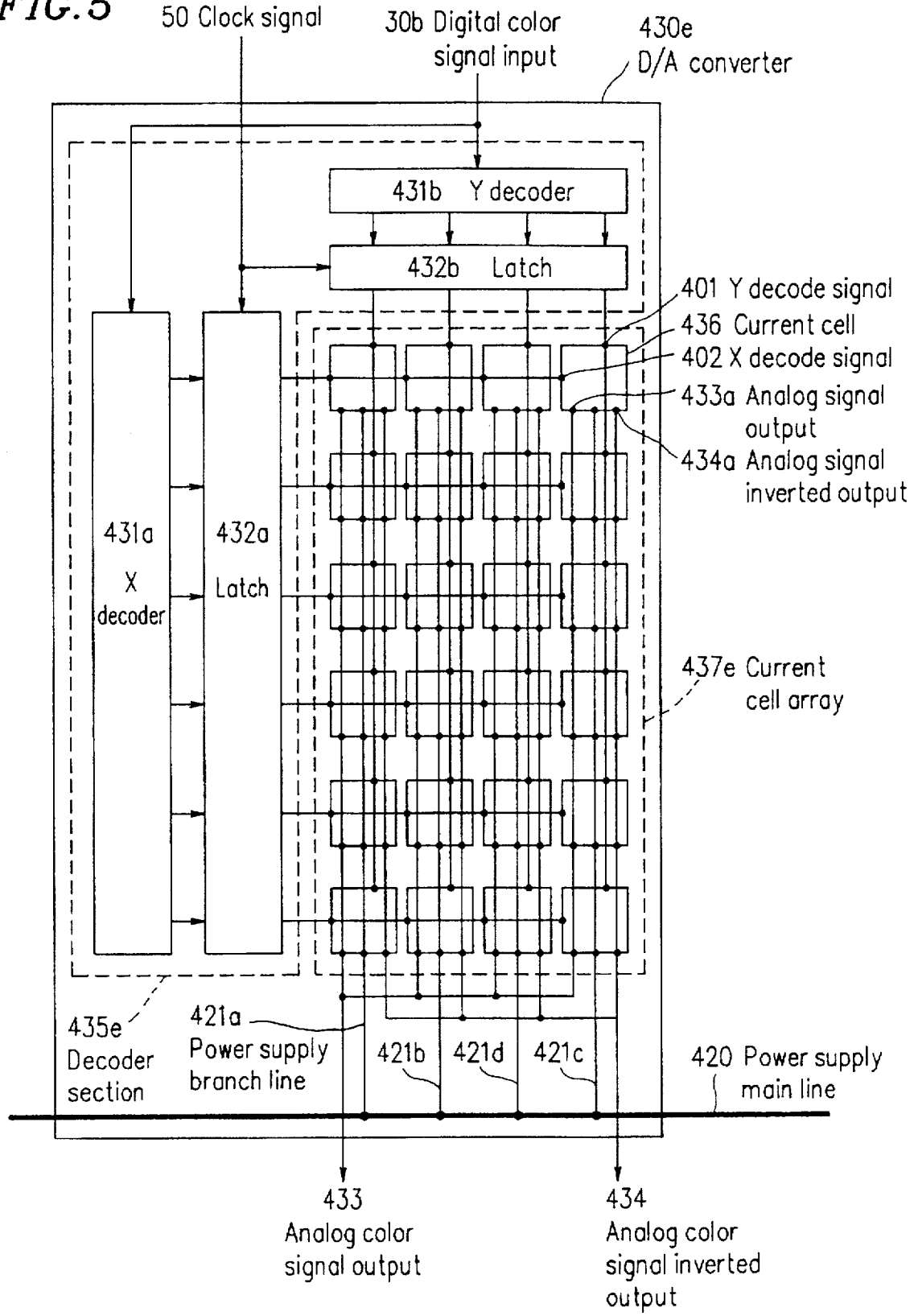
FIG. 5 is a diagram showing the configuration of a D/A converter in the example.

FIG. 5 shows the configuration of the D/A converter 430e. The configuration of each of the D/A converters 430a through 430d and 430f is the same as that of the D/A converter 430e.

The D/A converter 430e includes: a current cell array 437e including a plurality of current cells 436 arranged in a matrix; and a decoder section 435e for rendering zero or more of the plurality of current cells 436 active in accordance with the input digital color signal 30b. The decoder section 435e includes: an X decoder 431a for decoding a lower bit portion of the digital color signal 30b; a latch 432a for temporary holding an output from the X decoder 431a; a Y decoder 431b for decoding a higher bit portion of the digital color signal 30b; and a latch 432b for temporary holding an output of the Y decoder 431b.

The digital color signal 30b is divided into the lower bit portion and the higher bit portion, which are input to the X decoder 431a and the Y decoder 431b, respectively.

The decoder section 435e renders the cells 436 active, the number of which corresponds to the digital value of the digital color signal 30b. For example, in the case where the digital color signal 30b has the digital value of "1", the decoder section 435e renders one of the current cells 436 active. The current cell 436 which is rendered active is, for example, a current cell positioned in the first row and the first column of the current cell array 437e. The row of the current cells 436 to be rendered active is designated by the X decoder 431a, and the column of the current cells 436 to be rendered active is designated by the Y decoder 431b. In the case where the digital color signal 30b has the digital value of "2", the decoder section 435e renders two of the current cells 436 active. The two current cells 436 which are rendered active are, for example, a current cell positioned in the first row and the first column and a current cell positioned in the sixth row and the first column of the current cell array 437e. In this way, the decoder section 435e selectively renders zero or more of the plurality of current cells 436 active so as to eliminate the positional concentration of the current cells 436 to be rendered active in accordance with the digital color signal 30b. This operation is performed to minimize an integral error of the analog value in the D/A converter.

Each of the current cells 436 which are rendered active by the decoder section 435e outputs a current from the current output and stops the output from the inverted current output. On the other hand, each of the current cells 436 which are not rendered active by the decoder section 435e stops the output from the current output and outputs a current from the inverted current output. By coupling all current outputs from the respective current cells 436, an analog color signal output 433 is obtained. By coupling all inverted current outputs from the respective current cells 436, an analog color signal inverted output 434 is obtained.

Power supply branch lines 421a through 421d branched from the power supply main line 420 are connected to the respective current cells 436. A voltage from the power supplying circuits 410a through 410d is supplied to the respective current cells 436 via the power supply main line 420 and the power supply branch lines 421a through 421d.

Figure 6A:
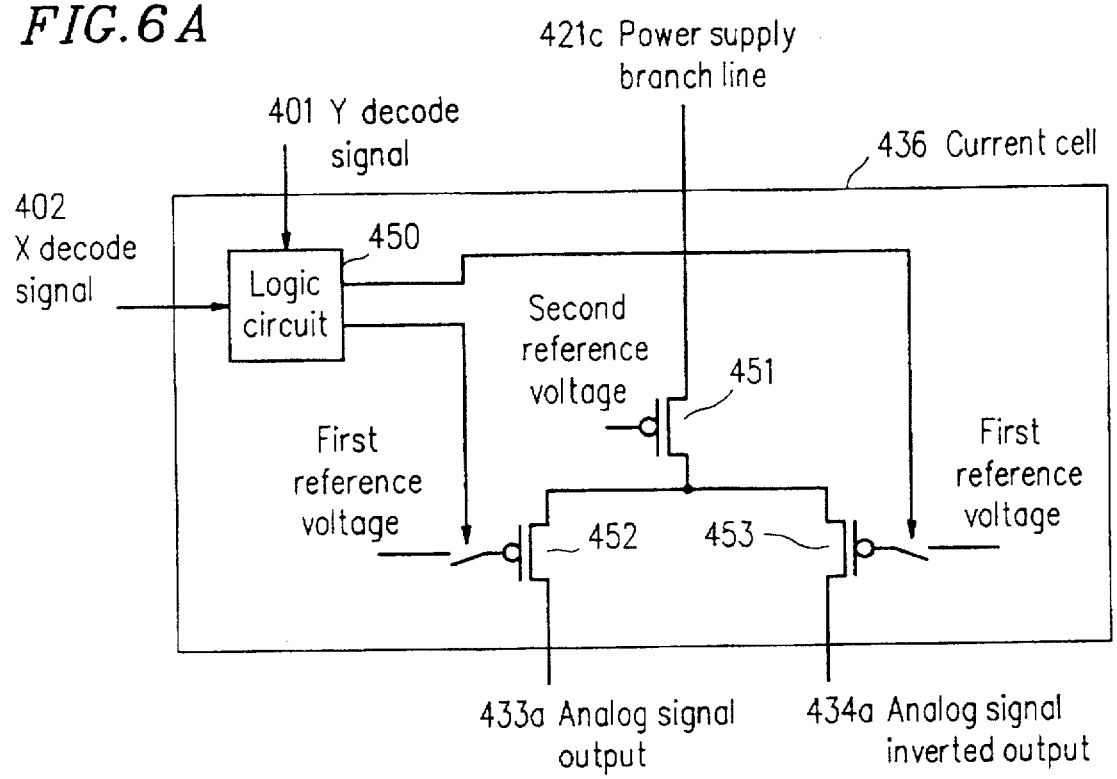
FIG. 6A is a diagram showing the configuration of a current cell including P type transistors in the example.

FIG. 6A shows the configuration of one current cell 436. The current cell 436 includes a logic circuit 450, a constant current source transistor 451 and switching transistors 452 and 453. The transistors 451 through 453 are P type transistors.

An X decode signal 401 output from the latch 432a and a Y decode signal 402 output from the latch 432b are input to the logic circuit 450. The logic circuit 450 generates a control signal for exclusively switching ON/OFF of the switching transistors 452 and 453 in accordance with the X decode signal 401 and the Y decode signal 402.

The constant current source transistor 451 generates a constant current based on a voltage $V_{DD}$ (power potential) supplied via the power supply branch line 421c. A source of the constant current source transistor 451 is connected to the power supplying circuits 410a through 410d via the power supply branch line 421c and the power supply main line 420. A predetermined second reference voltage is supplied to a gate of the constant current source transistor 451. The drain of the constant current source transistor 451 is connected to the sources of switching transistors 452 and 453.

Each of the switching transistors 452 and 453 is turned ON/OFF in accordance with the control signal from the logic circuit 450. When the switching transistor 452 is turned ON, the drain of the constant current source transistor 451 is connected to an analog signal output 433a. When the switching transistor 453 is turned ON, the drain of the constant current source transistor 451 is connected to an analog signal inverted output 434a.

In the case where the current cell 436 is to be rendered active, the logic circuit 450 turns the switching transistor 452 ON and the switching transistor 453 OFF by supplying a predetermined first reference voltage to the gate of the switching transistor 452. By this operation, a constant current from the constant current source transistor 451 is output to the analog signal output 433a.

In the case where the current cell 436 is not to be rendered active, the logic circuit 450 turns the switching transistor 452 OFF and the switching transistor 453 ON by supplying the predetermined first reference voltage to the gate of the switching transistor 453. By this operation, a constant current from the constant current source transistor 451 is output to the analog signal inverted output 434a.

Figure 6B:
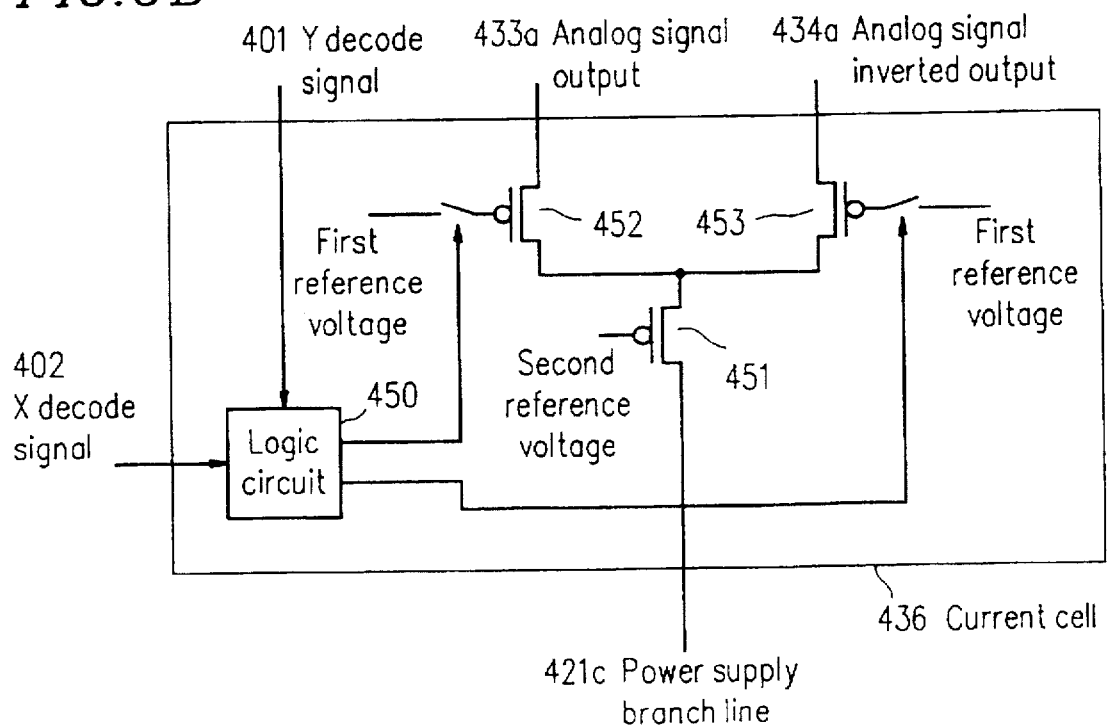
FIG. 6B is diagram showing the configuration of a current cell including N type transistors in the example.

FIG. 6B is an exemplary configuration of the current cell 436 using N type transistors. The constant current source transistor 451 generates a constant current based on a voltage $V_{GND}$ (ground potential) supplied via the power supply branch line 421c. Since the operation of the current cell 436 is the same as that of the current cell 436 shown in FIG. 6A, the description thereof is omitted.

In the following description, it is assumed that all current cells 436 shown in FIG. 5 are configured using N type transistors as shown in FIG. 6B. In this case, since a constant current output from the current cell 436 always flows into the power supply branch lines 421a through 421d, power supply float occurs in accordance with the wiring resistance of the power supply branch lines 421a to 421d. The power supply float decreases as it approaches the power supply main line 420. The power supply float also occurs due to the wiring resistance of the power supply main line 420 since a constant current flows into the power supply main line 420 from the power supply branch lines 421a through 421d. Therefore, every current cell 436 placed on the current cell array 437e is supplied with a voltage which is different from that supplied to another current cell 436, from the power supplying circuits 410a through 410d. As a result, since a potential at the source terminal of the constant current source transistor 451 varies depending on each current cell 436, a value of the current output from the current cell 436 varies depending on current cell 436. This causes a differential error and an integral error in the D/A converter. Herein, the differential error represents the degree of difference between the analog value corresponding to the digital value of 1 and the average analog value. For example, in the case where a digital value is represented by N bits, the average analog value is defined by (amount of full-scale current)/$2^N-1$. Generally, if the analog value corresponding to a digital value differs from the average analog value by ½ LSB or more of the average analog value, the digital value is erroneously converted to an incorrect analog value. The integral error is obtained by integrating a difference (a differential error) between an actually converted analog value and the average analog value with respect to all digital values.

Hereinafter, the integral error of the D/A converter will be described with reference to FIGS. 7A through 7E.

Ideally, it is desirable that the D/A converter outputs the analog value proportional to an input digital value. In actual cases, however, the digital value to be input is not perfectly proportional to the analog value to be output due to the problems of the power potential, changes in the voltage at the output terminal, variations in the process and the like.

Figure 7A:
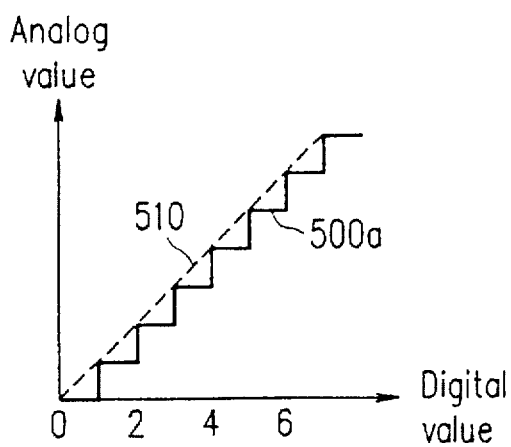
FIGS. 7A through 7E are graphs each showing an output analog value with respect to a digital value in the example.

In FIG. 7A, a dotted line 510 is an ideal curve showing the ideal relationship between the digital value to be input and the analog value to be output. A solid line 500a is an output curve showing the analog value output from an ideal D/A converter in the case where the digital value to be input is increased by 1 at a time. According to the ideal D/A converter, the solid line 500a increases along the ideal curve 510.

Figure 7B:
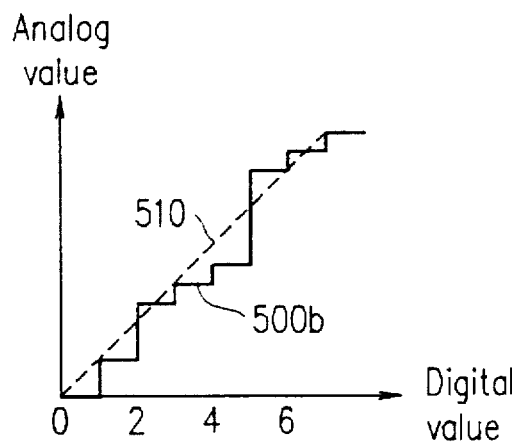

In FIG. 7B, a dotted line 510 represents an ideal curve. A solid line 500b is an output curve showing the analog value to be output from the D/A converter in the case where a current value from the current cell varies. As shown in FIG. 7B, the analog value, which is increased in the case where a digital value is increased by 1 at a time, is not uniform. The integral error is obtained by integrating the difference in the analog value between the dotted line (ideal line) 510 and the solid line 500b with respect to all digital values.

In the D/A converter, it is necessary to reduce the integral error. However, in the case where the outputs from two D/A converters are alternately added, it is not sufficient to reduce the integral error shown in FIG. 7B.

Figure 7C:
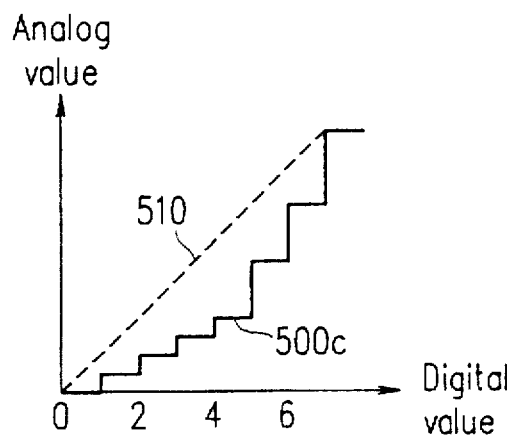

FIG. 7C is an output curve in the case where the analog value to be output from the D/A converter is larger than that indicated by the ideal curve 510 with respect to the same digital value.

Figure 7D:
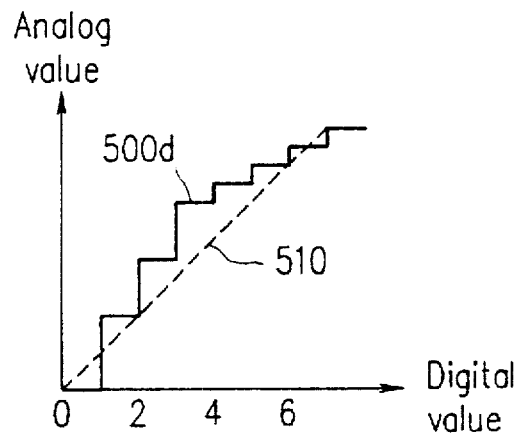

FIG. 7D is an output curve in the case where the analog value to be output from the D/A converter is smaller than that indicated by the ideal curve 510 with respect to the same digital value.

Figure 7E:
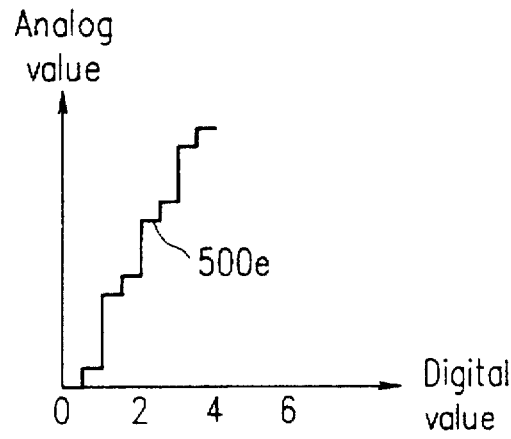

FIG. 7E shows the result of adding the output from the D/A converter having output characteristics represented by a solid line 500c of FIG. 7C and the output from the D/A converter having output characteristics represented by a solid line 500d of FIG. 7D while delaying one output from the other output by a ½ cycle of a clock signal when the digital value of T is input to the respective D/A converters at the T-th cycle of the clock signal. As shown in FIG. 7E, since matching of the output characteristics of the two D/A converters is poor, a large analog value and a small analog value are alternately added. When the outputs from the D/A converters are alternately added for the purpose of obtaining a smooth output, the variation of the analog outputs from the conversion elements included in the D/A converter results in causing a distortion.

The reason why such distortion occurs is as follows. The D/A converter having output characteristics represented by the solid line 500c in FIG. 7C outputs a relatively small analog value with respect to a small digital value and a relatively large analog value with respect to a large digital value. On the other hand, the D/A converter having output characteristics represented by the solid line 500d in FIG. 7D outputs a relatively large analog value with respect to a small digital value and a relatively small analog value with respect to a large digital value. Therefore, in order to prevent distortion from occurring, it is necessary to make the output curves of D/A converters identical with each other in addition to minimizing the differences between the ideal curve 510 and the output curve in each D/A converter.

In this example, as shown in FIG. 4, a current cell array section 437c including a plurality of current cells and a decoder section 435c in the D/A converter 430c and a current cell array section 437d including a plurality of current cells and a decoder section 435d in the D/A converter 430d are symmetrically arranged with respect to a symmetry axis 460. Thus, the D/A converter 430d has the configuration which is obtained by inverting the configuration of the D/A converter 430c with respect to the symmetry axis 460.

In the same manner, a current cell array section 437e including a plurality of current cells and a decoder section 435e in the D/A converter 430e and a current cell array section 437f including a plurality of current cells and a decoder section 435f in the D/A converter 430f are symmetrically arranged with respect to a symmetry axis 461. Thus, the D/A converter 430f has the configuration which is obtained by inverting the configuration of the D/A converter 430e with respect to the symmetry axis 461.

The power supplying circuits 410b and 410c are arranged so as to be apart from the symmetry axis 460 by substantially the same distance, respectively. The power supplying circuits 410c and 410d are arranged so as to be apart from the symmetry axis 461 by substantially same the distance, respectively. By this arrangement, predetermined current cells which are rendered active upon input of the same digital value are symmetrically arranged with respect to the power supplying circuit in each D/A converter. This symmetrical layout makes the power potentials of active current cells identical with each other in each D/A converter. As a result, a first D/A converter has the same output curve as that of a second D/A converter having the configuration obtained by inverting the configuration of the first D/A converter with respect to the symmetrical axis.

Figure 8A:
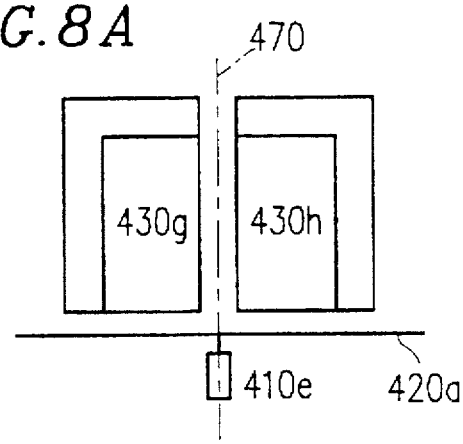
FIGS. 8A through 8C are diagrams each showing the arrangement of D/A converters in the example.
Figure 8B:
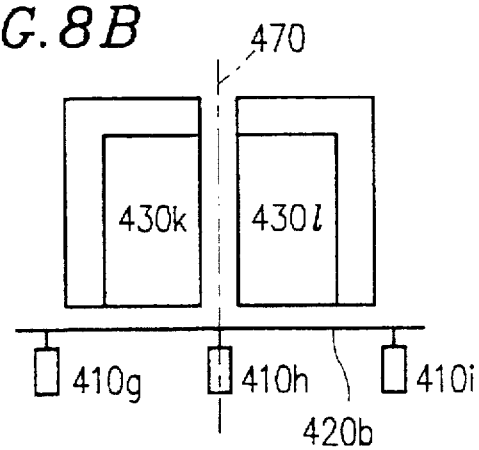
Figure 8C:
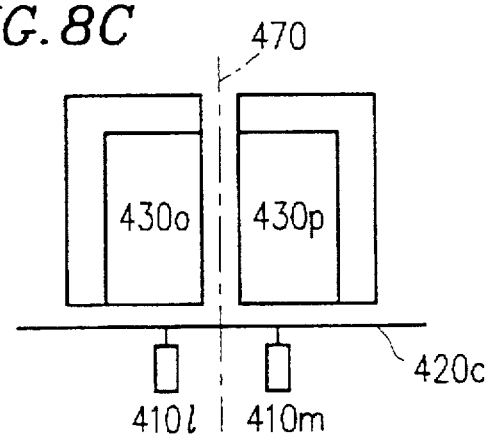

FIGS. 8A through 8C show exemplary arrangements of a D/A converter and one or more power supplying circuit in the case where a D/A conversion device according to the present invention has two D/A converters.

In an exemplary arrangement shown in FIG. 8A, a D/A converter 430h has the configuration obtained by inverting the configuration of a D/A converter 430g with respect to a symmetry axis 470. A power supplying circuit 410e is placed on the symmetry axis 470.

In an exemplary arrangement shown in FIG. 8B, a D/A converter 430l has the configuration obtained by inverting the configuration of a D/A converter 430k with respect to the symmetry axis 470. Power supplying circuits 410g through 410i are respectively placed so as to be apart from the symmetry axis 470 by the same distance.

In an exemplary arrangement shown in FIG. 8C, a D/A converter 430p has the configuration obtained by inverting the configuration of a D/A converter 430o with respect to the symmetry axis 470. Power supplying circuits 410l and 410m are respectively placed so as to be apart from the symmetry axis 470 by the same distance.

By such arrangement, the power potentials of active current cells become identical with each other in each D/A converter. As a result, since the output curves of D/A converters become identical with each other, it is possible to restrict an output error among D/A converters.

Figure 9A:
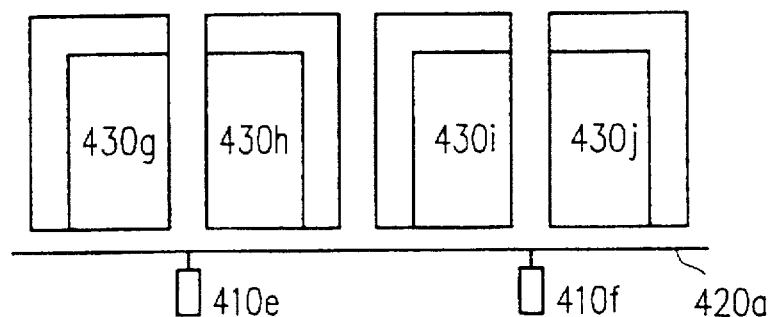
FIGS. 9A through 9C are diagrams each showing the arrangement of D/A converters in the example.
Figure 9B:
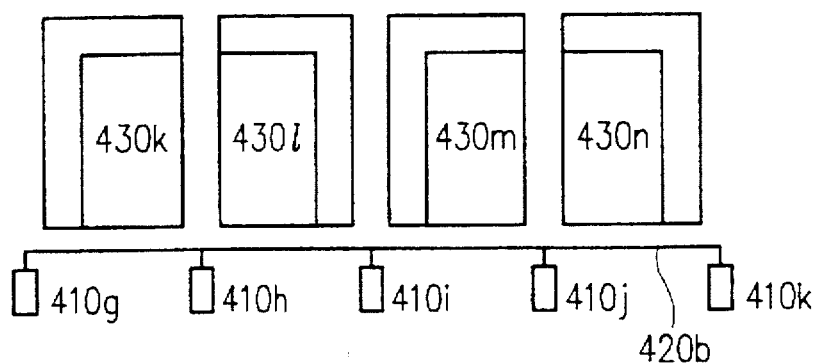
Figure 9C:
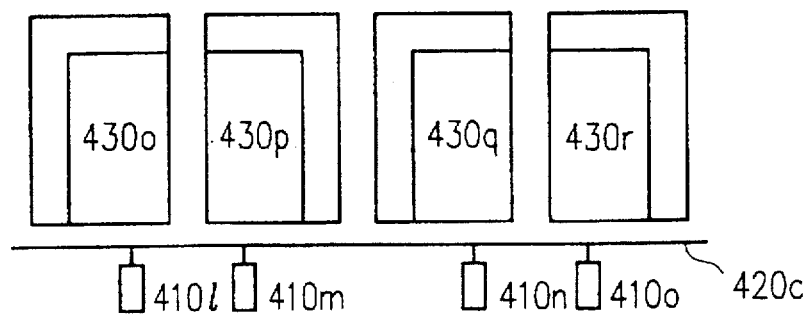

FIGS. 9A through 9C show exemplary arrangements of a D/A converter and one or more power supplying circuits in the case where a D/A conversion device according to the present invention has four D/A converters. In any arrangement, power supplying circuits are placed so as to be relatively apart from D/A converters by the same distance. Such an arrangement makes it possible to restrict an output error among D/A converters.

Next, with reference to FIGS. 10A, 10B, 11A, 11B, 12A and 12B, additional effects of the present invention will be described.

Figure 10:
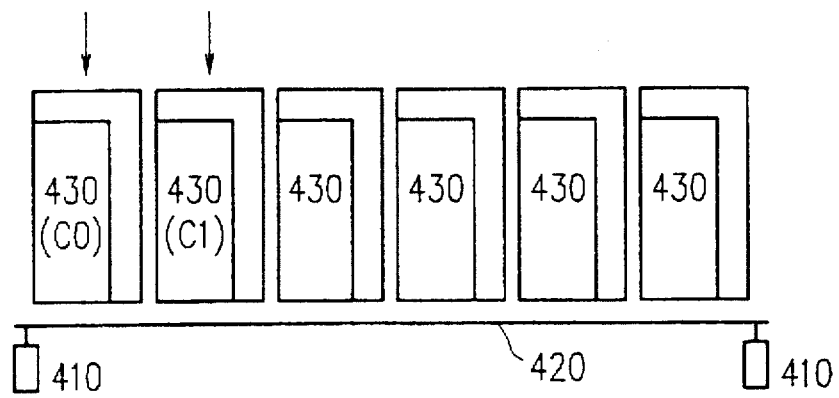
FIG. 10A is a diagram showing the general arrangement of D/A converters.
FIG. 10B is a graph showing an error in the general arrangement of D/A converters.
Figure 10:
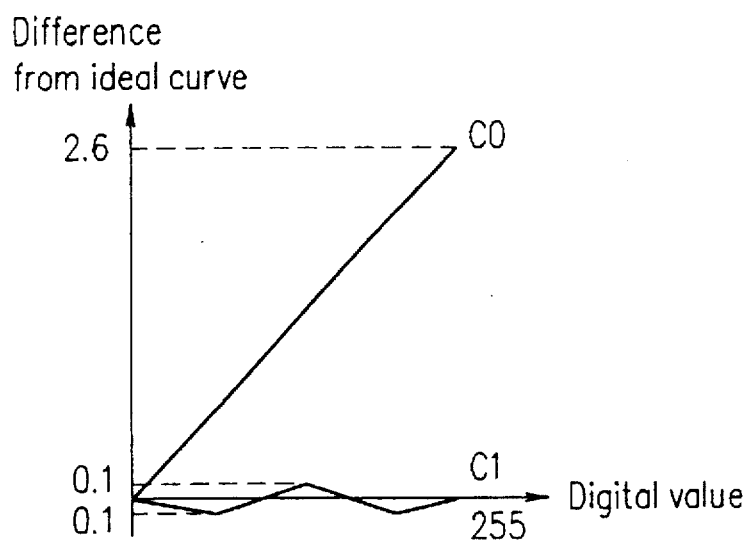
Figure 11A:
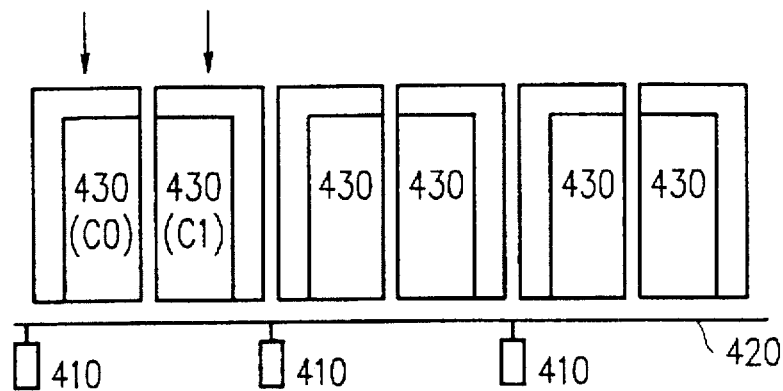
FIG. 11A is a diagram showing the arrangement of D/A converters in the example according to the present invention.
Figure 12A:
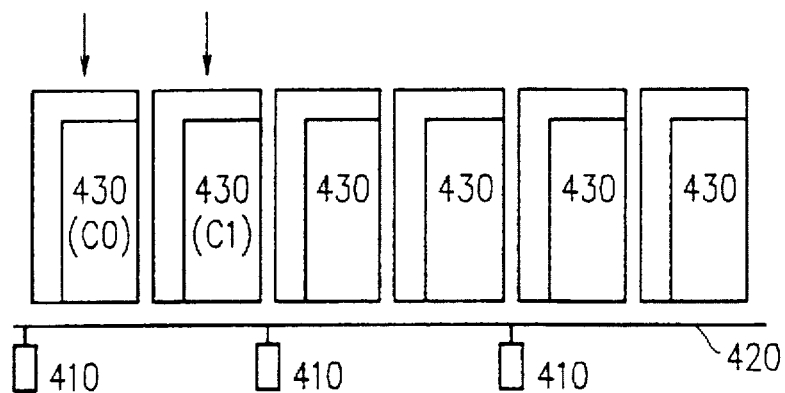
FIG. 12A is a diagram showing the arrangement of D/A converters in the example according to the present invention.

It is assumed that the area, the amount of current and the width of the power supply wiring of D/C converter are the same in FIGS. 10A, 11A and 12A. A D/A converter (C0) and a D/A converter (C1) indicated with arrows in FIGS. 10A, 11A and 12A are D/A converters performing the same D/A conversion. It is assumed that an error of the D/A converter (C0) is the substantially same as that of the D/A converter (C1) as a single D/A converter.

FIG. 10A shows an exemplary arrangement in which six D/A converters 430 having the same configuration are arranged in a row, and power supplying circuits 410 are placed at both ends of a set of D/A converters. Regarding the arrangement shown in FIG. 10A, errors produced by the differences in the power potentials are calculated by simulation.

FIG. 10B shows the difference from an ideal curve in the case where the amount of current output from the D/A converter (C1) is used as a reference, when the D/A converter (C0) and the D/A converter (C1) are used in combination. Due to the difference in the total amount of current and the difference in tendency of the output curves, a difference of 2.6 times of the average analog value is generated in the D/A converter (C0) at maximum.

Figure 11B:
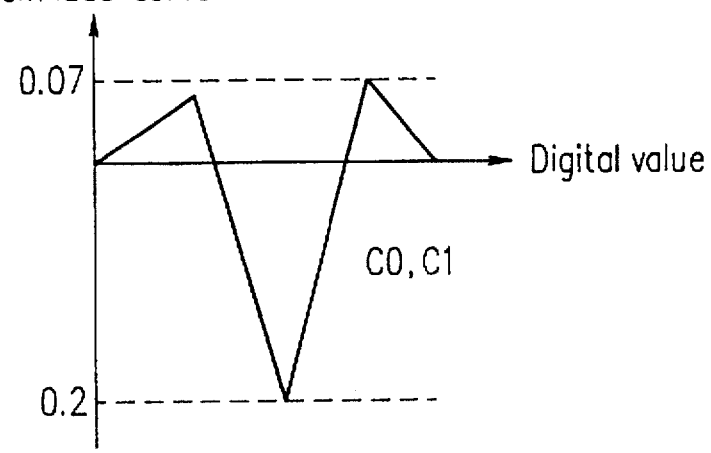
FIG. 11B is a graph showing an error in the arrangement of D/A converters in the example according to the present invention.

FIG. 11A shows an exemplary arrangement, in which three pairs of D/A converters 430, each pair having the symmetrical configuration with respect to a symmetry axis, are arranged in a row and the power supplying circuits 410 are arranged so as to be apart from the symmetry axes by the same distance. By rearranging the arrangement shown in FIG. 10A into the arrangement shown in FIG. 11A, a difference from the ideal curve is perfectly identical between the pair of D/A converters 430 as shown in FIG. 11B. Therefore, in this case, it is sufficient to take an error in each D/A converter 430 alone into consideration.

FIG. 12A shows a preferred arrangement in which the D/A converters 430 are placed so as to be apart from the power supplying circuits 410 by the same distance without inverting the layout of the D/A converters 430. In this case, the variation in the power voltage of the power supply main line is the same among the D/A converters 430. Therefore, a full-scale current of one D/A converters 430 is the same as that of another D/A converter 430. However, the output curves of the D/A converters are not identical with each other. Therefore, as shown in FIG. 12B, a difference between an output from the D/A converter (C0) and an output from the D/A converter (C1) reaches 0.4 LSB at maximum.

Figure 12B:
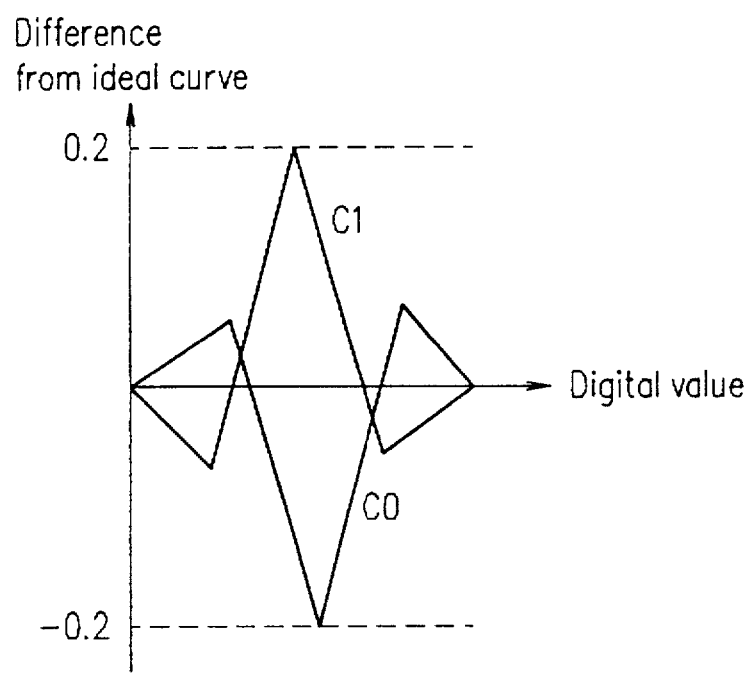
FIG. 12B is a graph showing an error in the arrangement of D/A converters in the example according to the present invention.

In calculating the results shown in FIG. 12B, a width of the decoder section in each D/A converter 430 is neglected. In the actual layout, it is necessary to arrange the power supplying circuits 410 taking the positional relationships between the power supplying circuits 410 and the decoder section and the current cell array section in each D/A converter 430 into consideration so that the variations in power voltage is the same among the D/A converters 430. The results obtained with such arrangement are identical with the results shown in FIG. 12B.

As described above, according to the example, the power potential float of each conversion element, which is caused by a constant current flowing through the power supply main line and the power supply branch lines, is made identical in the D/A converters, thereby providing a D/A conversion device performing highly accurate D/A conversion without distortion.

According to the present invention, a power potential of a conversion element rendered active in one D/A converter becomes substantially equal to that of a conversion element rendered active in another D/A converter. As a result, an output current of one D/A converter becomes identical with that of another D/A converter. Thus, in the case where an output from one D/A converter and an output from another D/A converter are added to each other while delaying one output from another output by a ½ cycle of a clock signal, a smooth output can be obtained.

Moreover, according to the present invention, it is not necessary to provide a dedicated power supply wiring so as to reduce an error between D/A converters. Therefore, one wiring layer serves both a power supply wiring and other wirings. Furthermore, it is not necessary to widen a power supply main line so as to reduce errors among D/A converters. Therefore, a chip area can be kept as small as a conventional chip area.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A D/A conversion device comprising:
   first conversion means for converting a digital signal into an analog signal;
   second conversion means for converting a digital signal into an analog signal;
   power supplying means for supplying a voltage to the first conversion means and the second conversion means; and
   a power supply main line for connecting the first conversion means and the second conversion means to the power supplying means,
   wherein each of the first conversion means and the second conversion means includes a plurality of conversion elements, each converting a unit digital value to a unit analog value, and a voltage rise or a voltage drop caused by resistance of the power supply main line from the power supplying means to the first conversion means is substantially equal to a voltage rise or a voltage drop caused by resistance of the power supply main line from the power supplying means to the second conversion means.

2. A D/A conversion device according to claim 1, wherein the resistance of the power supply main line from the power supplying means to the first conversion means is substantially equal to the resistance of the power supply main line from the power supplying means to the second conversion means.

3. A D/A conversion device according to claim 1, wherein each of the first conversion means and the second conversion means includes: a power supply branch line for connecting each of the plurality of conversion elements to the power supply main line; and decode means for selectively rendering zero or more of the plurality of conversion elements active in accordance with the digital signal, and a voltage rise or a voltage drop caused by resistance of the power supply branch line in the first conversion means is substantially equal to a voltage rise or a voltage drop caused by resistance of the power supply branch line in the second conversion means.

4. A D/A conversion device comprising:
   first conversion means for converting a digital signal into an analog signal;
   second conversion means for converting a digital signal into an analog signal; and
   at least one power supplying means for supplying a voltage to the first conversion means and the second conversion means,
   wherein each of the first conversion means and the second conversion means includes: a plurality of converters, each converting a unit digital value into a unit analog value; and a decoder for selectively rendering zero or more of the plurality of conversion elements active in accordance with the digital signal,
   the plurality of conversion elements and the decoder included in the first conversion means are placed symmetrical to the plurality of conversion elements and the decoder included in the second conversion means with respect to an axis, and
   each of the at least one power supplying means is arranged so as to be substantially the same distance from the axis.

5. A D/A conversion device according to claim 4, further comprising output means for adding an output from the first conversion means in an earlier half of a predetermined time period and an output from the second conversion means in a later half of the predetermined time period and for outputting an added output.

6. A D/A conversion device according to claim 4, wherein one of the at least one power supplying means is arranged on the axis.

7. A D/A conversion device according to claim 4, wherein each of the plurality of conversion elements includes: a constant current source for generating a constant current based on a voltage supplied from one of the at least one power supplying means; and switching means connected to the constant current source, for switching ON/OFF in response to a control signal.

8. A D/A conversion device according to claim 7, wherein the constant current source is a transistor.

9. A D/A conversion device according to claim 4, wherein the plurality of conversion elements are arranged in a matrix form, and the decoder selectively renders zero or more of the plurality of conversion elements active so as to eliminate positional concentration of the conversion element rendered active in accordance with the digital signal.

\* \* \* \* \*